United States Patent
Arp et al.

(10) Patent No.: US 11,088,684 B2
(45) Date of Patent: Aug. 10, 2021

(54) CALIBRATING INTERNAL PULSES IN AN INTEGRATED CIRCUIT

(71) Applicant: International Business Machines Corporation, Armonk, NY (US)

(72) Inventors: Andreas H. A. Arp, Nufringen (DE); Fatih Cilek, Boeblingen (DE); Michael V. Koch, Ehningen (DE); Thomas Makowski, Pfullingen (DE); Matthias Ringe, Tuebingen (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 437 days.

(21) Appl. No.: 16/199,548

(22) Filed: Nov. 26, 2018

(65) Prior Publication Data

US 2020/0169251 A1    May 28, 2020

(51) Int. Cl.
| | |
|---|---|
| *H03K 5/19* | (2006.01) |
| *G06F 1/10* | (2006.01) |
| *G01R 31/317* | (2006.01) |
| *H03K 5/1534* | (2006.01) |

(52) U.S. Cl.
CPC ......... *H03K 5/19* (2013.01); *G01R 31/31725* (2013.01); *G06F 1/10* (2013.01); *H03K 5/1534* (2013.01)

(58) Field of Classification Search
None
See application file for complete search history.

(56) References Cited

U.S. PATENT DOCUMENTS

| | | | |
|---|---|---|---|
| 794,229 A | 7/1905 | Jovignot | |
| 7,142,998 B2 | 11/2006 | Watson, Jr. et al. | |
| 7,944,229 B2 | 5/2011 | Joshi et al. | |
| 7,973,549 B2 | 7/2011 | Joshi et al. | |
| 8,385,394 B2 | 2/2013 | Kam et al. | |
| 8,937,494 B1 | 1/2015 | Arp et al. | |
| 10,879,882 B1 * | 12/2020 | Shing | H03K 5/135 |
| 2003/0151433 A1 * | 8/2003 | Takai | G11C 11/4076 327/158 |

(Continued)

FOREIGN PATENT DOCUMENTS

CN    102073008 B    5/2013

OTHER PUBLICATIONS

Franch et al.; "On-chip Timing Uncertainty Measurements on IBM Microprocessors"; International Test Conference; 2007; pp. 1-7.

*Primary Examiner* — Cassandra F Cox
(74) *Attorney, Agent, or Firm* — Cantor Colburn LLP; Margaret McNamara

(57) ABSTRACT

An integrated circuit is provided. The integrated circuit includes a plurality of skitter circuits and a multiplexer that provides the waveform to the plurality of skitter circuits. The plurality of skitter circuits includes at least a first skitter circuit and a second skitter circuit. The first and second skitter circuits are arranged in parallel with respect to an output of the multiplexer. The first skitter circuit can include a first data path and a plurality of first inverters on that first data path. Further, the second skitter circuit can include a second data path, a plurality of second inverters on the second data path, and a delay element connected in series with an input of an initial inverter of the plurality of second inverters on the second data path.

20 Claims, 4 Drawing Sheets

(56) References Cited

U.S. PATENT DOCUMENTS

2008/0309364 A1* 12/2008 Joshi ................ G01R 31/31725
                                              324/750.02
2020/0158779 A1*  5/2020 Arp .................... G01R 31/2884

\* cited by examiner

CALIBRATING INTERNAL PULSES IN AN INTEGRATED CIRCUIT

BACKGROUND

The disclosure relates generally to calibration circuits, and more specifically, to calibrating internal pulses in an integrated circuit.

In general, skitter is a cognomen for skew and jitter measurements. A skitter circuit is a component of an integrated circuit and allows for measuring periodic signals. However, current skitter circuits lack timing granularity for measuring periodic signals.

SUMMARY

According to one or more embodiments, an integrated circuit is provided. The integrated circuit includes a plurality of skitter circuits and a multiplexer that provides the waveform to the plurality of skitter circuits. The plurality of skitter circuits includes at least a first skitter circuit and a second skitter circuit. The first and second skitter circuits are arranged in parallel with respect to an output of the multiplexer. The first skitter circuit can include a first data path and a plurality of first inverters on that first data path. Further, the second skitter circuit can include a second data path, a plurality of second inverters on the second data path, and a delay element connected in series with an input of an initial inverter of the plurality of second inverters on the second data path.

According to one or more embodiments, the above integrated circuit can be implemented in a processor and/or a system.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The foregoing and other features, and advantages of the embodiments herein are apparent from the following detailed description taken in conjunction with the accompanying drawings in which:

DETAILED DESCRIPTION

Figure 1:
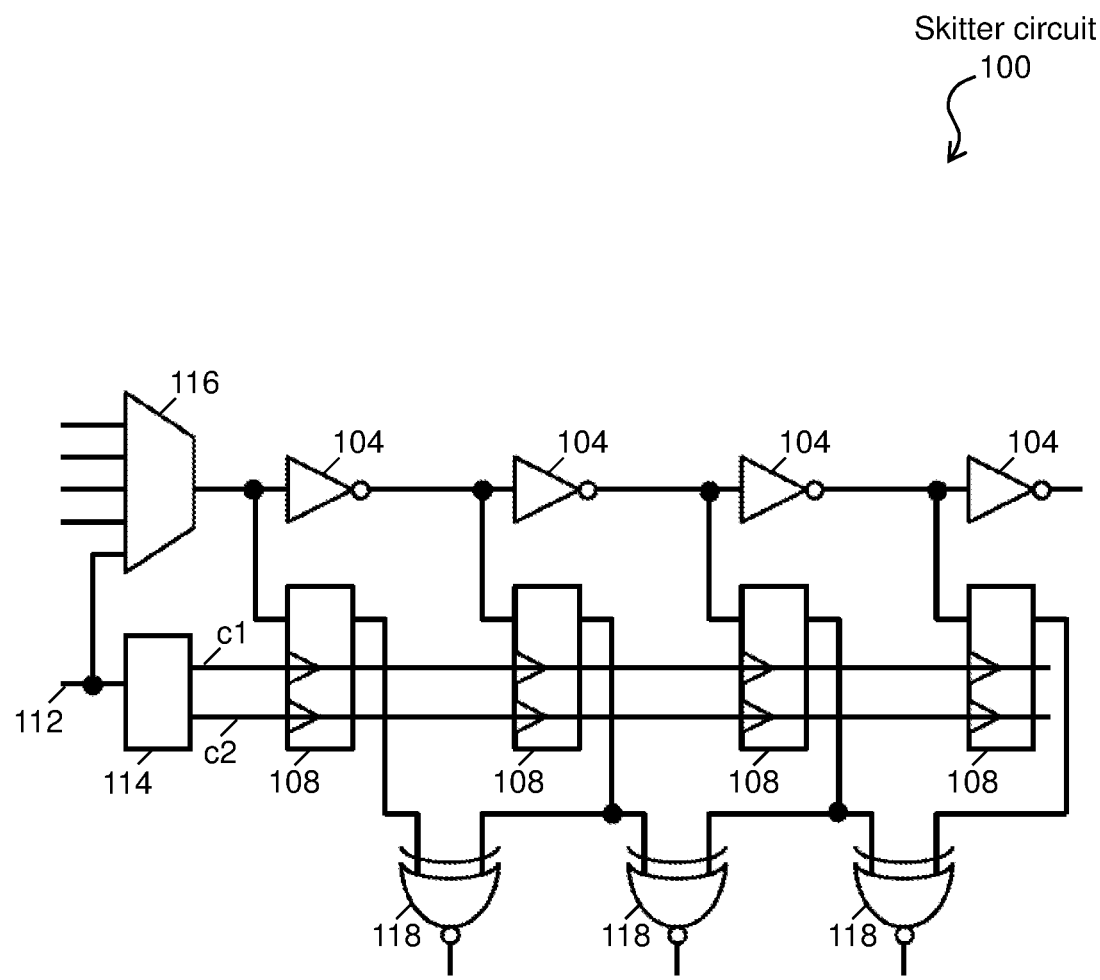
FIG. 1 depicts a schematic diagram showing a skitter circuit in accordance with one or more embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, as discussed above, current skitter circuits lack timing granularity for measuring periodic signals. Referring now to FIG. 1, a skitter circuit 100 includes a delay line including a plurality of delay elements 104. The delay elements 104 may include inverters, although of types of delay elements may be employed instead of or in addition to inverters, e.g., inverting transmission gates, stacked inverters, logic gates, etc. A plurality of sampling latches 108 tap the delay line, such that a data input for each latch 108 is connected between two delay elements 104.

The latches 108 are clocked in accordance with clocks c1 and c2. Clocks c1 and c2 are derived from a global clock 112, which may be a chip clock or even a local clock for a portion of an integrated circuit chip. Clock 112 may be split in a local clock block (LCB) 114, such that c1 and c2 are the data capture and data launch clocks which are derived from the same clock global signal, running along different conductors. In one embodiment, c1 operates a master latch and c2 operates a slave latch in latches 108. (However, for some master-slave latches, only one clock is needed.) The rising edge of the clock may trigger the master, and the falling edge of the clock may trigger the slave. Latches 108 are operated in accordance with c1 and c2 to pass sampled data received from the delay line. Any number of latches 108 may be employed to correspond with a structure or bandwidth of a given device and may be changed as needed.

A multiplexer 116 may selectively switch between wordline signals, which are input to the skitter circuit 200 for edge detection. The initial delay element 104 and sampling latch data is an alternating pattern of 1's and 0's. Edges of the wordline trace or signal and the clock signal result in mid-cycle edges and full cycle edges. By analyzing the latch outputs, a sequence of binary data results in an alternating pattern where the edges or transitions are denoted by binary digits of a same value adjacent to one another (e.g., 11 or 00). The latch outputs are coupled to exclusive NOR gates (XNOR) 118 or other equivalent logic. The XNOR gates 118 test whether adjacent latches 108 have the same data value. The XNOR gates 118 determine edge locations for internal pulses of, e.g., a wordline.

In accordance with one or more embodiments, an operation of the skitter circuit 100 is described. Assuming input clock can be static; all inverters (e.g., delay elements 104) are also static and their outputs have inverted signals of their inputs. These Boolean values are latched by registers (e.g., latches 108) and then XNORed (e.g., XNOR gates 118). The Boolean XNOR function yields one if both inputs are equal. In the static case assumed here, this cannot be the case. Thus, the outputs of all XNOR gates 118 are zero.

Assuming that the selected input at the multiplexer 116 has a rising transition and all registers (e.g., latches 108) are being latched when the first inverter (e.g., initial delay element 104) is switching, the input of the first inverter has already switched from zero to one while the output of the first inverter has not yet made the transition and remains at one as well. In this instance, both input and output of the first inverter are one, and the output of the corresponding XNOR will also be one. The skitter circuit 100, thus, yields a sequence of zeros and ones with the ones representing a transition of the signal under test. As the delay of the inverters can be assumed to be nearly constant this allows for judging on duty-cycle, jitter, and skews.

Turning now to an overview of the aspects of the invention, one or more embodiments of the invention address the above-described shortcomings of the prior art by providing an integrated circuit for performing measurements on a waveform. In operation, the integrated circuit uses parallel skitter circuits with respect to a delay to provide the technical effect and benefit of an increased accuracy (e.g., increased timing granularity) for waveform measurements. Note that the parallel skitter circuits and/or the integrated circuit may be implemented in a processor, a system, or combination thereof.

In accordance with one or more embodiments, the integrated circuit includes a plurality of skitter circuits (e.g., at least a first skitter circuit and a second skitter circuit; such as a skitter circuit and a copy of that skitter circuit, except multiplexer and LCB) and a multiplexer that provides the waveform to the plurality of skitter circuits. All of the skitter circuits can be arranged in parallel. More particularly, the first and second skitter circuits are arranged in parallel with respect to an output of the multiplexer. On at least one of the data paths of the parallel skitter circuits, a delay element is included to implement a delay, e.g., by half of an inverter delay. More particularly, the first skitter circuit can include a first data path and a plurality of first inverters on that first data path. Further, the second skitter circuit can include a second data path, a plurality of second inverters on the second data path, and a delay element connected in series with an input of an initial inverter of the plurality of the second inverters on the second data path.

Figure 2:
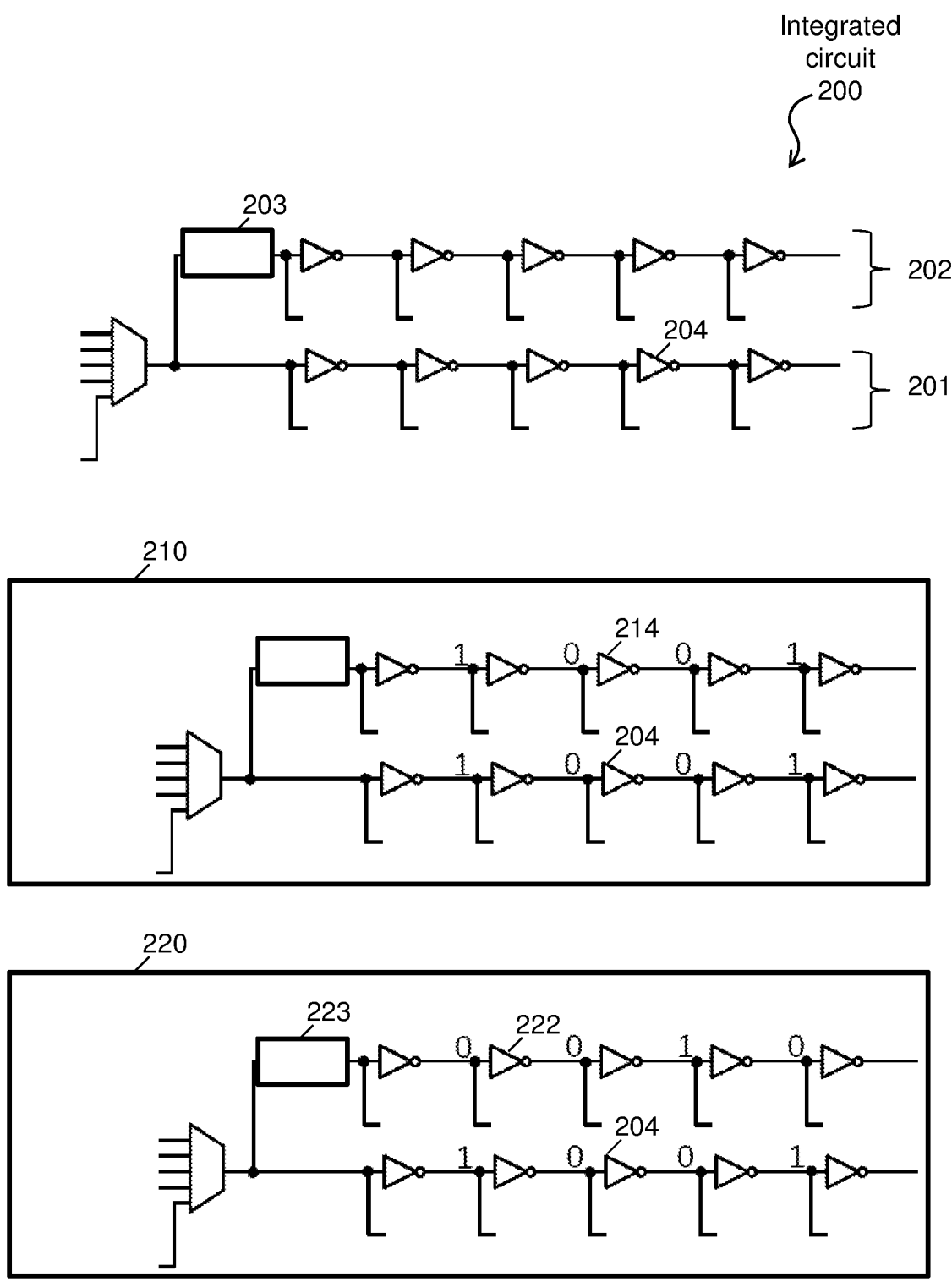
FIG. 2 depicts a circuit diagram showing an integrated circuit in accordance with one or more embodiments.

Turning now to FIG. 2, a schematic diagram flow of an integrated circuit 200 in accordance with one or more embodiments. The integrated circuit 200 includes a first inverter chain 201 and a second inverter chain 202. The first inverter chain 201 does not include a delay and may be referred to as a non-delayed chain. The second inverter chain 202 includes a delay 203, which can be programmable (e.g., by half of an inverter delay), and may be referred to as a delayed inverter chain. The integrated circuit 200 does not show the LCB, registers, and XNORs for ease of explanation. Assuming that a transition is recorded at a third inverter 204 of the non-delayed chain 201 with a zero value at both input and output, two scenarios may occur.

In a first scenario 210, a possible outcome is that the transition happens at a same position in a delayed inverter chain 202 (at a third inverter 214). In this regard, the waveform in the non-delayed chain 201 is early with respect to the capturing clock. In contrast, the waveform in the delayed inverter chain 202 is late with respect to the capturing clock. Yet, both transitions occur at the same position.

In a second scenario 220, the waveform in the non-delayed chain 201 is late with respect to the capturing clock. In contrast, the transition of the waveform in the delayed inverter chain 202 is moved by one inverter position (notably to the left at a second inverter 222) due to the delay 223 being activated. Assuming each inverter of the non-delayed chain 201 has a delay of 1 the bit pattern of a skitter circuit, then the arrival times measured in each consecutive inverter is as follows: −0.5, −1.5, −2.5, −3.5, −4.5, −5.5. In turn, or the delayed inverter chain 202, the arrival times measured in each consecutive inverter is as follows: 0.0, −1.0, −2.0, −3.0, −4.0, −5.0.

As an example, the transition of the integrated circuit in the second scenario 220 are illustrated in the following patterns: 10000001000000000001 for the delayed inverter chain 202 and 10000000100000000001 for the non-delayed chain 201. Note that the first and last 'ones' of these patterns are unchanged, which indicates that these events are relatively early in the non-delayed chain 201. Further, note that the middle 'one' in each pattern differs by a single position. The difference between the second and first one bits is proportional to the duty cycle: 7 inverter delays in the delayed inverter chain 202 and 8 inverter delays in the non-delayed chain 201 in absolute numbers (e.g., or 35% and 40%, relatively). The real duty cycle may be closer to the average value of 37.5%. Note that a plain skitter would have yielded 40%. As such small delays are difficult to create reliably, a delay difference can be determined as described with respect to FIGS. 3-4.

Figure 3:
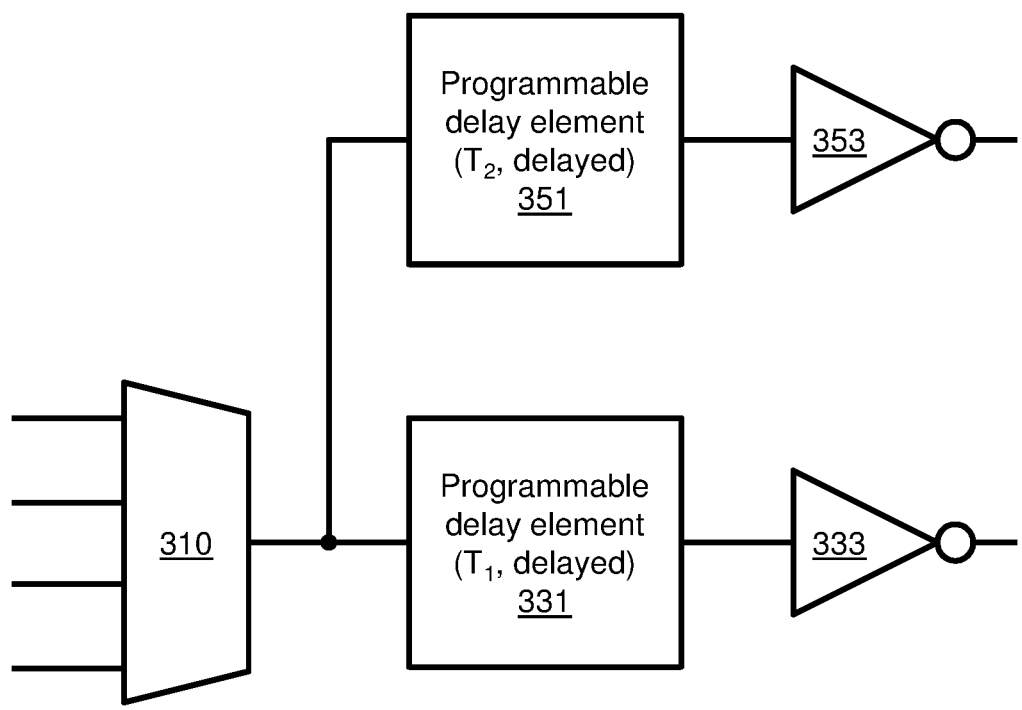
FIG. 3 depicts a schematic diagram flow in accordance with one or more embodiments.
Figure 4:
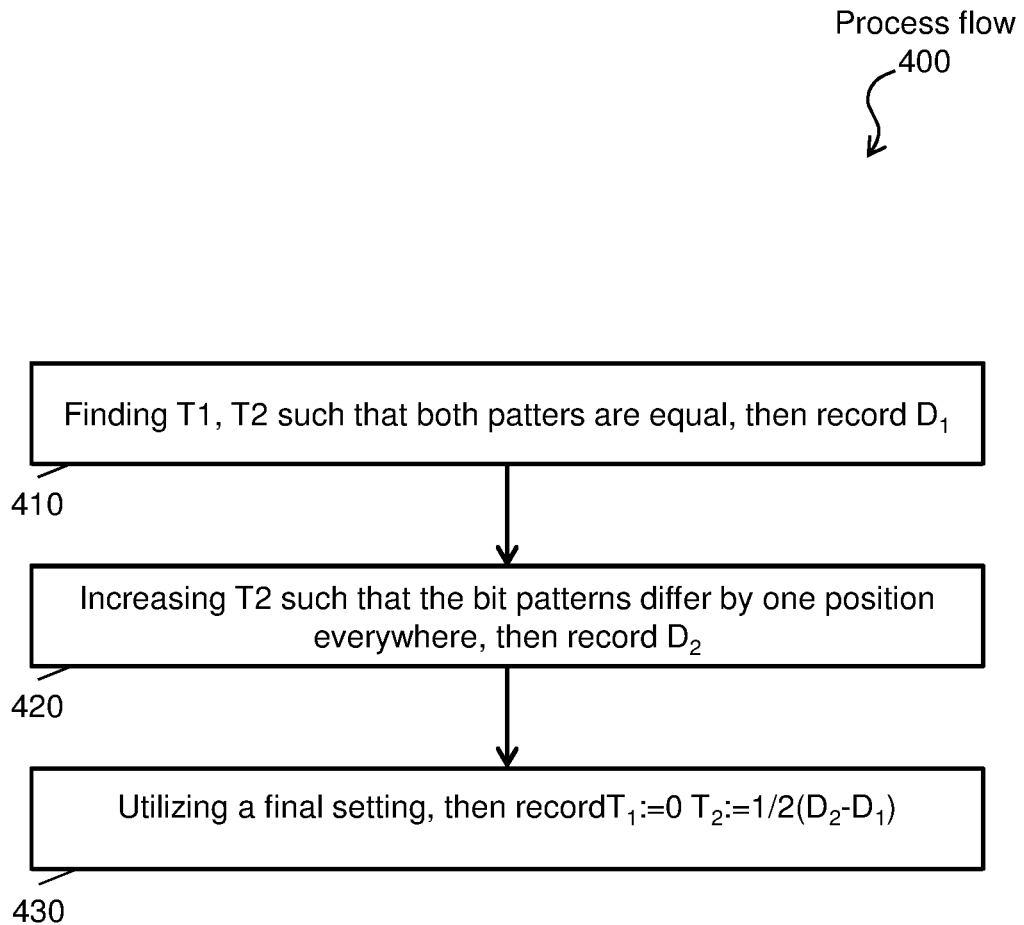
FIG. 4 depicts a process flow in accordance with one or more embodiments.

FIG. 3 depicts a circuit diagram showing an integrated circuit 300 in accordance with one or more embodiments. FIG. 4 depicts a process flow 400 in accordance with one or more embodiments. The integrated circuit 300 includes a multiplexer 310, a first programmable element 331, and an initial inverter 333 of a first skitter circuit. The integrated circuit 300 also includes a second programmable element 351 and an initial inverter 353 of a second skitter circuit. The integrated circuit 300 does not show the remaining inverters, LCB, registers, and XNORs for ease of explanation.

The programmable elements 331 and 352 can be any programmable logic controller (PLC) or programmable controller adapted for receiving and storing a numerical value representing a programmable delay. Accordingly, the programmable element 331 can implement a programmable delay $T_1$, and the programmable element 351 can implement a programmable delay $T_2$. Thus, a total delay D is defined by the following equation:

$$D=T_2-T_1 \quad \text{Equation 1}$$

The programmable elements 331 and 352 can further include (non-transitory) memory for storing a training algorithm determining the programmable delay and a processor for executing the training algorithm. Note that the training algorithm is software executable by any processor to cause a determination of the programmable delay and to provide the programmable delay for implementation. In accordance with one or more embodiments, the integrated circuit 300 can be implemented in a processor and/or system that is executing the training algorithm and that provides the programmable delay outputted by the training algorithm to the programmable elements 331 and 352 for implementation. In this scenario, the training algorithm interacts with the integrated circuit 300 to perform measurements using one or more waveforms to effect a timing granularity of the measurements by integrated circuit 300. For example, turning to FIG. 4, the process flow 400 illustrates an operation of the training algorithm.

The process flow 400 begins at block 410, where the training algorithm finds $T_1$ and $T_2$, such that both patterns are equal. For instance, the training algorithm causes the multiplexer 310 to provide a waveform, the training algorithm sets $T_1$ and $T_2$ to the same value, and the training algorithm records D according to Equation 1.

At block 420, the training algorithm increases $T_2$ such that the bit patterns differ by one position everywhere. The training algorithm then records $D_2$ according to Equation 1.

At block 430, the training algorithm utilizes a final setting. Then, the training algorithm records $T_1$ and $T_2$, as shown in Equation 2 and 3. Note that the embodiments herein can be further enhanced by using n inverter chains and a delay of multiples of $D_n$. In this regard, the training algorithm can utilize Equation 4 instead of Equation 3.

$$T_1=0 \quad \text{Equation 2}$$

$$T_2=\frac{1}{2}(D_2-D_1) \quad \text{Equation 3}$$

$$T_2=1n(D_2-D_1) \quad \text{Equation 2}$$

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit for performing measurements on a waveform, the integrated circuit comprising:
a plurality of skitter circuits comprising a first skitter circuit and a second skitter circuit; and
a multiplexer providing the waveform to the plurality of skitter circuits,
wherein the first and second skitter circuits are arranged in parallel with respect to an output of the multiplexer,
wherein the first skitter circuit comprises a first data path and a plurality of first inverters on the first data path,
wherein the second skitter circuit comprises a second data path, a plurality of second inverters on the second data path, and a delay element connected in series with an input of an initial inverter of the plurality of the second inverters on the second data path.

2. The integrated circuit of claim 1, wherein the delay element implements a delay by half of an inverter delay.

3. The integrated circuit of claim 1, wherein the delay element is programmable to effect a timing granularity of the measurements by integrated circuit.

4. The integrated circuit of claim 1, wherein the first skitter circuit comprises a delay element connected in series with an input of an initial inverter of the plurality of the first inverters on the first data path.

5. The integrated circuit of claim 4, wherein the delay element is programmable to effect a timing granularity of the measurements by integrated circuit.

6. The integrated circuit of claim 1, wherein a training algorithm determines a programmable delay implemented by the delay element.

7. The integrated circuit of claim 1, wherein a training algorithm interacts with the integrated circuit to perform measurements using one or more waveforms to effect a timing granularity of the measurements by integrated circuit.

8. A processor comprising:
an integrated circuit for performing measurements on a waveform, the integrated circuit comprising:
a plurality of skitter circuits comprising a first skitter circuit and a second skitter circuit; and
a multiplexer providing the waveform to the plurality of skitter circuits,
wherein the first and second skitter circuits are arranged in parallel with respect to an output of the multiplexer,
wherein the first skitter circuit comprises a first data path and a plurality of first inverters on the first data path,
wherein the second skitter circuit comprises a second data path, a plurality of second inverters on the second data path, and a delay element connected in series with an input of an initial inverter of the plurality of the second inverters on the second data path.

9. The processor of claim 8, wherein the delay element implements a delay by half of an inverter delay.

10. The processor of claim 8, wherein the delay element is programmable to effect a timing granularity of the measurements by integrated circuit.

11. The processor of claim 8, wherein the first skitter circuit comprises a delay element connected in series with an input of an initial inverter of the plurality of the first inverters on the first data path.

12. The processor of claim 11, wherein the delay element is programmable to effect a timing granularity of the measurements by integrated circuit.

13. The processor of claim 8, wherein a training algorithm determines a programmable delay implemented by the delay element.

14. The processor of claim 8, wherein a training algorithm interacts with the integrated circuit to perform measurements using one or more waveforms to effect a timing granularity of the measurements by integrated circuit.

15. A system comprising:
a processor comprising:
an integrated circuit for performing measurements on a waveform, the integrated circuit comprising:
a plurality of skitter circuits comprising a first skitter circuit and a second skitter circuit; and
a multiplexer providing the waveform to the plurality of skitter circuits,
wherein the first and second skitter circuits are arranged in parallel with respect to an output of the multiplexer,
wherein the first skitter circuit comprises a first data path and a plurality of first inverters on the first data path,
wherein the second skitter circuit comprises a second data path, a plurality of second inverters on the second data path, and a delay element connected in series with an input of an initial inverter of the plurality of the second inverters on the second data path.

16. The system of claim 15, wherein the delay element implements a delay by half of an inverter delay.

17. The system of claim 15, wherein the delay element is programmable to effect a timing granularity of the measurements by integrated circuit.

18. The system of claim 15, wherein the first skitter circuit comprises a delay element connected in series with an input of an initial inverter of the plurality of the first inverters on the first data path.

19. The system of claim 18, wherein the delay element is programmable to effect a timing granularity of the measurements by integrated circuit.

20. The system of claim 15, wherein a training algorithm determines a programmable delay implemented by the delay element.

* * * * *